US011711959B2

(12) United States Patent
Kim et al.

(10) Patent No.: US 11,711,959 B2
(45) Date of Patent: Jul. 25, 2023

(54) DISPLAY DEVICE

(71) Applicant: SAMSUNG ELECTRONICS CO., LTD., Suwon-si (KR)

(72) Inventors: Tae Gon Kim, Hwaseong-si (KR); Sung Hun Lee, Hwaseong-si (KR); Shin Ae Jun, Seongnam-si (KR); Deukseok Chung, Yongin-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

(*) Notice: Subject to any disclaimer, the term of this patent is extended or adjusted under 35 U.S.C. 154(b) by 0 days.

(21) Appl. No.: 17/474,051

(22) Filed: Sep. 14, 2021

(65) Prior Publication Data

US 2021/0408138 A1 Dec. 30, 2021

Related U.S. Application Data

(63) Continuation of application No. 16/424,729, filed on May 29, 2019, now Pat. No. 11,139,346.

(30) Foreign Application Priority Data

May 29, 2018 (KR) .......................... 10-2018-0061208

(51) Int. Cl.
*H10K 59/38* (2023.01)
*H10K 50/844* (2023.01)
(Continued)

(52) U.S. Cl.
CPC .............. *H10K 59/38* (2023.02); *G02B 3/00* (2013.01); *G02B 5/201* (2013.01); *H10K 50/844* (2023.02);
(Continued)

(58) Field of Classification Search
CPC .............. H01L 27/322; H01L 51/5253; H01L 51/5262; H01L 51/5275; H01L 2251/5369;
(Continued)

(56) References Cited

U.S. PATENT DOCUMENTS 7,948,166 B2   5/2011   Kwak et al.
8,405,063 B2   3/2013   Kazlas et al.
(Continued)

FOREIGN PATENT DOCUMENTS

CN   101533850 A   9/2009
JP   2010151880    7/2010
(Continued)

OTHER PUBLICATIONS

Extended European Search Report—European Patent Application No. 19176235.0 dated Nov. 6, 2019.
(Continued)

*Primary Examiner* — David Vu
*Assistant Examiner* — Brandon C Fox
(74) *Attorney, Agent, or Firm* — Cantor Colburn LLP

(57) ABSTRACT

A display device includes an organic emission layer in which a first pixel area, a second pixel area and a third pixel area are defined, a color filter layer disposed on the organic emission layer and including first to third color filters overlapping the first to third pixel areas, respectively, where the first to third color filters emit first light to third light, respectively, a first optical filter layer disposed on the color filter layer and which transmits at least one of the first light and the second light and reflects or absorbs the third light, and a light-focusing layer disposed between the color filter layer and the organic emission layer and including first to third light-focusing parts overlapping the first to third pixel (Continued)

areas, respectively, where at least one of the first to third color filters includes quantum dots.

18 Claims, 14 Drawing Sheets

(51) Int. Cl.
| | | |
|---|---|---|
| H10K 102/00 | (2023.01) | |
| H10K 50/00 | (2023.01) | |
| G02B 3/00 | (2006.01) | |
| G02B 5/20 | (2006.01) | |
| H10K 50/85 | (2023.01) | |
| H10K 50/858 | (2023.01) | |
| H10K 59/00 | (2023.01) | |

(52) U.S. Cl.
CPC ........... H10K 50/85 (2023.02); H10K 50/858 (2023.02); *H10K 50/00* (2023.02); *H10K 59/00* (2023.02); *H10K 2102/331* (2023.02)

(58) Field of Classification Search
CPC .......... G02B 3/00; G02B 5/201; H10K 59/38; H10K 50/844; H10K 50/85; H10K 50/858; H10K 2102/331; H10K 59/00; H10K 50/00
See application file for complete search history.

(56) References Cited

U.S. PATENT DOCUMENTS

| | | | |
|---|---|---|---|
| 8,759,850 B2 | 6/2014 | Coe-Sullivan et al. | |
| 8,981,386 B2 * | 3/2015 | Lim .................... | H01L 51/5275 313/504 |
| 9,142,802 B2 | 9/2015 | Miyamoto et al. | |
| 9,368,757 B2 | 6/2016 | Choi et al. | |
| 10,033,014 B2 | 7/2018 | Chen et al. | |
| 10,126,587 B2 | 11/2018 | Chung | |
| 10,516,140 B2 | 12/2019 | Chen et al. | |
| 10,520,765 B2 | 12/2019 | Chung | |
| 10,522,791 B2 | 12/2019 | Chen et al. | |
| 11,355,737 B2 | 6/2022 | Chen et al. | |
| 2012/0104367 A1 | 5/2012 | Hasegawa et al. | |
| 2013/0242228 A1 | 9/2013 | Park et al. | |
| 2015/0048333 A1 * | 2/2015 | Choi .................... | H01L 51/5275 257/40 |
| 2015/0048348 A1 | 2/2015 | Huang et al. | |
| 2015/0084026 A1 | 3/2015 | Miyamoto et al. | |
| 2015/0102291 A1 | 4/2015 | Park et al. | |
| 2015/0228697 A1 | 8/2015 | Liu et al. | |
| 2015/0277188 A1 * | 10/2015 | He ....................... | G02B 6/0011 349/61 |
| 2015/0318506 A1 | 11/2015 | Zhou et al. | |
| 2015/0333108 A1 | 11/2015 | Miyamoto et al. | |
| 2015/0380688 A1 | 12/2015 | Chen et al. | |
| 2017/0082892 A1 * | 3/2017 | Chung .................. | G02F 2/02 |
| 2017/0102487 A1 | 4/2017 | Lee et al. | |
| 2017/0343859 A1 * | 11/2017 | Chen .................... | G02B 5/201 |
| 2018/0088261 A1 * | 3/2018 | Song .................... | G02B 5/206 |
| 2018/0166643 A1 * | 6/2018 | Kim .................... | H01L 51/5262 |
| 2018/0342703 A1 | 11/2018 | Chen et al. | |
| 2019/0006630 A1 | 1/2019 | Chen et al. | |
| 2019/0072815 A1 | 3/2019 | Chung | |
| 2020/0083485 A1 | 3/2020 | Chen et al. | |
| 2020/0172806 A1 | 6/2020 | Park et al. | |

FOREIGN PATENT DOCUMENTS

| | | |
|---|---|---|
| JP | 2015069700 | 4/2015 |
| KR | 838087 B1 | 6/2008 |
| KR | 1020100116330 | 11/2010 |
| KR | 1020140014684 A | 2/2014 |
| KR | 1020140143916 A | 12/2014 |
| KR | 1020150019325 A | 2/2015 |
| KR | 1020150039066 A | 4/2015 |
| KR | 1020160029087 | 3/2016 |
| KR | 1020170017683 | 2/2017 |
| KR | 1020170034055 | 3/2017 |
| KR | 1020170041951 A | 4/2017 |
| KR | 1020170094166 | 8/2017 |

OTHER PUBLICATIONS

Korean Office Action—Korean Patent Application No. 10-2018-0061208 dated Oct. 14, 2022.
Korean Office Action issued in corresponding Korean Patent Application No. 10-2018-0061208 dated Apr. 24, 2023, references listed within (w/translation).

* cited by examiner

DISPLAY DEVICE

CROSS-REFERENCE TO RELATED APPLICATION

This application is a continuation of U.S. patent application Ser. No. 16/424,729, filed on May 29, 2019, which claims priority to Korean Patent Application No. 10-2018-0061208, filed on May 29, 2018, and all the benefits accruing therefrom under 35 U.S.C. § 119, the content of which in its entirety is herein incorporated by reference.

BACKGROUND

1. Field

The disclosure relates to a display device for displaying an image.

2. Description of the Related Art

As a display device, a liquid crystal display, a plasma display device, an organic light emitting display or the like is currently commercially available, and such a display device may be driven with pixels, each of which emits one of red light, green light, blue light and/or white light, or by passing light emitted by a light source through a color filter to express colors corresponded to the pixels.

In a case of a display device including pixels that individually emit one of primary color lights, a high color purity enough to provide high image quality may be achieved, but a process difficulty for manufacturing in a large scale may be high since each pixel is formed with different materials having different characteristics from each other.

On the other hand, in a case of a display device in which light from the light source passes through color filters, manufacturing in a large scale may be effectively achieved, but a luminance and a color purity may be deteriorated since the emitted light ma have a relatively wide full width at half maximum ("FWHM") when passed through the color filters by which light is absorbed and energy loss occurs.

SUMMARY

An embodiment provides a display device with reduced energy loss of emitted light and for providing high color purity and color reproducibility and being easily applicable even for a large-scale process.

According to an embodiment, a display device includes an organic emission layer in which a first pixel area, a second pixel area, and a third pixel area are defined; a color filter layer disposed on the organic emission layer, where the color filter layer includes first to third color filters overlapping the first to third pixel areas, respectively, and emits first light to third light, respectively, which are different from one another; a first optical filter layer disposed on the color filter layer, where the first optical filter transmits at least one of the first light and the second light and reflects or absorbs the third light; and a light-focusing layer disposed between the color filter layer and the organic emission layer, where the light-focusing layer includes first to third light-focusing parts overlapping the first to third pixel areas, respectively, where at least one of the first to third color filters includes quantum dots.

In an embodiment, the first optical filter layer may block light having a wavelength less than or equal to about 500 nanometers (nm).

In an embodiment, the first optical filter layer may be disposed to overlap at least one of the first pixel area and the second pixel area.

In an embodiment, the first optical filter layer may be integrally formed as a single unitary unit, and an opening may be defined in the first optical filter at a position overlapping the third pixel area.

In an embodiment, a refractive index of the light-focusing layer may be in a range from about 1.4 to about 2.5.

In an embodiment, a gap between the organic emission layer and the color filter layer may be in a range from about 5 micrometers (μm) to about 100 μm.

In an embodiment, each of the first to third light-focusing parts may include a convex lens, a micro-prism, a planar lens, a Fresnel lens, a metamaterial, or a combination thereof.

In an embodiment, at least one of the first to third light-focusing parts may include a convex lens, and a tilting angle of the convex lens may be in a range from about 30 degrees to about 90 degrees.

In an embodiment, at least one of the first to third light-focusing parts may include a micro-prism and a tilting angle of the micro-prism may be in a range from about 20 degrees to about 80 degrees.

In an embodiment, a width of each of the first to third light-focusing parts may be larger than a width of a corresponding one of the first to third pixel areas.

In an embodiment, at least two of each of the first to third light-focusing parts may be disposed to overlap a corresponding pixel area.

In an embodiment, each of the first to third pixel areas of the organic emission layer may emit the first light.

In an embodiment, a width of each of the first to third color filters may be the same as a width of a corresponding one of the first to third pixel areas.

In an embodiment, the display device may further include a second optical filter layer disposed between the color filter layer and the organic emission layer, where the second optical filter layer transmits the third light and reflects at least one of the first light and the second light.

In an embodiment, the second optical filter layer may reflect light having a wavelength greater than about 500 nm.

In an embodiment, the display device may further include a sealing layer disposed between the second optical filter layer and the light-focusing layer and having a refractive index lower than a refractive index of the light-focusing layer.

In an embodiment, the first light may be a red light, the second light may be a green light, and the third light may be a blue light.

In such an embodiment of a display device, the energy loss of emitted light is minimized, color purity and color reproducibility are improved, and such an embodiment of a display device is easily applicable even for a large-scale process.

BRIEF DESCRIPTION OF THE DRAWINGS

These and/or other features of the invention will become apparent and more readily appreciated from the following description of the exemplary embodiments, taken in conjunction with the accompanying drawings, in which.

DETAILED DESCRIPTION

Figure 1:
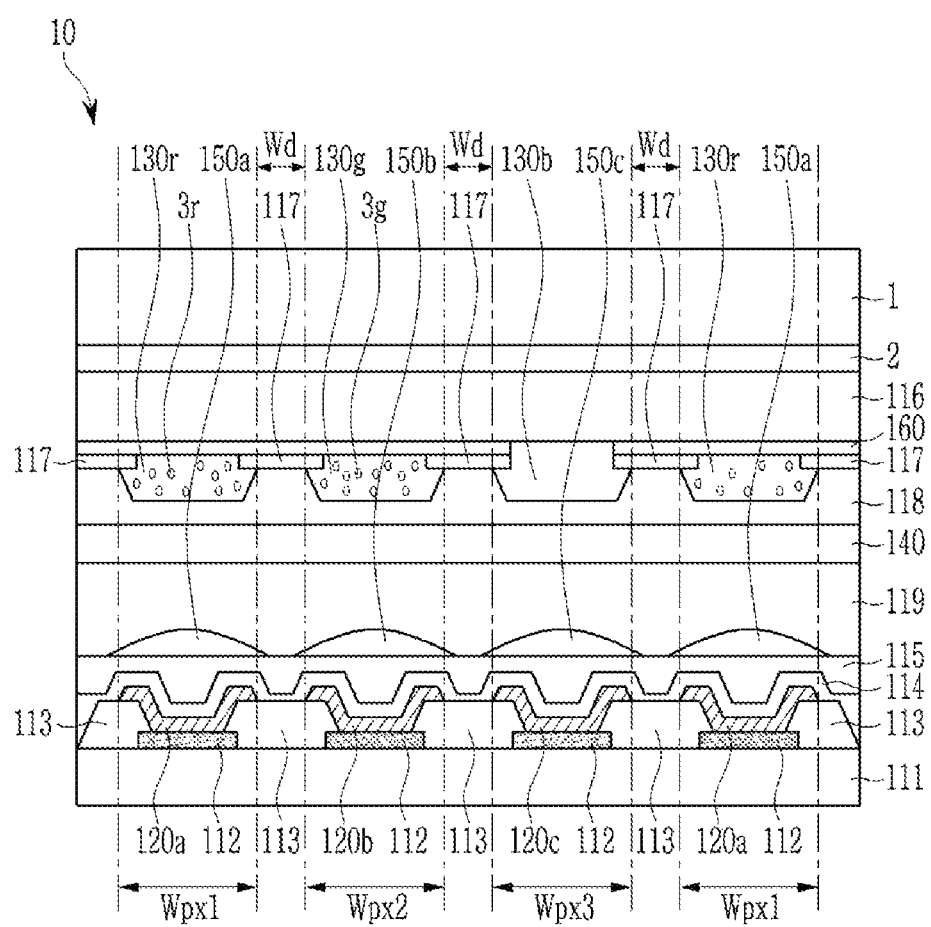
FIG. 1 is a cross-sectional view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Exemplary embodiments are described herein with reference to cross section illustrations that are schematic illustrations of idealized embodiments.

As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

A structure of an embodiment of a display device 10 will be described referring to FIG. 1.

FIG. 1 is a cross-sectional view of a display device according to an embodiment.

Referring to FIG. 1, an embodiment of the display device 10 includes a first substrate 111, a plurality of pixel electrodes 112 disposed on the first substrate 111, a pixel define layer 113 disposed between adjacent pixel electrodes 112, and an organic emission layer 120 disposed on each of the pixel electrodes 112, a common electrode 114 disposed on the organic emission layer 120, a first planarization layer 115 disposed on the common electrode 114, a light-focusing (or light-condensing) layer 150 disposed on first planarization layer 115, a sealing layer 119 disposed on the light-focusing layer 150, a second optical filter layer 140 disposed on the sealing layer 119, a second planarization layer 118 disposed on the second optical filter layer 140, a color filter layer 130 disposed on the second planarization layer 118 and including quantum dots 3, and a second substrate 116 disposed on the color filter layer 130, a first optical filter layer 160 disposed on the color filter layer 130, and an adhesion layer 2 and a cover layer 1 disposed on the second substrate 116.

In such an embodiment, the display device 10 includes the organic emission layer 120 and the color filter layer 130 including the quantum dots 3. In such an embodiment, the organic emission layer 120 provides or emits light to the color filter layer 130, and the provided light is supplied to quantum dots 3 in the color filter layer 130. As the result, light emitted to the outside of the display device 10 through the organic emission layer 120 and the color filter layer 130 may include light which is converted by the quantum dots 3 to have a wavelength in a predetermined wavelength region.

The quantum dots 3 have a discontinuous energy band gap by the quantum confinement effect to convert incident light to light in a predetermined wavelength and to radiate the converted light. Particularly, the quantum dots 3 may control to narrow a full width at half maximum ("FWHM") of a light-emitting wavelength spectrum in several tens nanometers, e.g., less than or equal to about 50 nanometers (nm), less than or equal to about 40 nm, or less than or equal to about 30 nm. Thus, in such an embodiment, the display device 10 may display an image with improved color purity and improved color reproducibility using the quantum dots 3.

In an embodiment, the display device 10 may be driven in a top-emission that light supplied from the organic emission layer 120 is emitted to the outside through the color filter layer 130. The driving system of such a top-emission type is more desirable than a bottom-emission type in a view of an aperture ratio of each pixel area. Accordingly, in an embodiment, the display device 10 may show a high luminance image using the top-emission.

In such an embodiment of the display device 10, a first panel including the organic emission layer 120 may be attached to a second panel including the color filter layer 130 after fabricating each of the first and second panels since the process temperature of the color filter layer 130 including quantum dots 3 is different from the temperature of forming the organic emission layer 120, unlike a conventional color filter.

Thus, hereinafter, constituent elements included in the first panel and constituent elements included in the second panel will be sequentially described in detail.

According to an embodiment, as shown in FIG. 1, the first panel of the display device 10 has a structure where the first substrate 111, the pixel electrode 112, the pixel define layer 113, the organic emission layer 120, the common electrode 114, the first planarization layer 115, the light-focusing layer 150, and a sealing layer 119 are stacked sequentially one on another.

The first substrate 111 may include an insulating material and may have flexibility. In one embodiment, for example, the first substrate 111 may include or be formed of at least one selected from glass, quartz and ceramic ,or may be a flexible substrate including or made of a plastic. The first substrate 111 may include or be made of a polymer material such as polyimide ("PI"), poly carbonate ("PC"), polyether sulfone ("PES"), polyethylene terephthalate ("PET"), polyethylene naphthalate ("PEN"), polyarylate ("PAR"), a fiber glass reinforced plastic ("FRP"), and the like. The first substrate 111 may be transparent, semi-transparent, or opaque.

The pixel electrode 112 may function as an anode of the display device 10. The pixel electrode 112 may include or be formed of a transparent conductive material such as indium tin oxide ("ITO") or indium zinc oxide ("IZO"), for example. The pixel electrode 112 may include or be formed of a material having a light-blocking properties such as gold (Au), platinum (Pt), nickel (Ni), tungsten (W), chromium (Cr), molybdenum (Mo), iron (Fe), cobalt Co), copper (Cu), palladium Pd), titanium (Ti), and the like. Alternatively, the pixel electrode 112 may have a two-layered structure where the transparent conductive material and the material having light-blocking properties are stacked sequentially one on another.

In an embodiment, although not shown in FIG. 1, a line layer including a thin film transistor or the like is disposed on the first substrate 111. The line layer may further include a gate line, a sustain voltage line, a gate insulating layer, a data line, a source electrode, a drain electrode, a semiconductor, a protective layer, or the like. The detail structure of the line layer may be various modified.

The gate line and the sustain voltage line are electrically separated or insulated from each other, and the data line is insulated and crossing the gate line and the sustain voltage line. The gate electrode, the source electrode and the drain electrode may define a control terminal, an input terminal, and an output terminal of the thin film transistor, respectively. The drain electrode is electrically connected to the pixel electrode 112.

Between two adjacent pixel electrodes 112, a pixel define layer 113 overlapping a terminal end of the pixel electrode 112 to divide the pixel electrode 112 into a pixel unit. The pixel define layer 113 is an insulation layer which may electrically block or insulated the at least two pixel electrodes 112 from each other.

The pixel define layer 113 covers a part of the upper surface of the pixel electrode 112, and the remaining region of the pixel electrode 112 where is not covered by the pixel define layer 113 may defined an opening. An organic emission layer 120, which will be described later, may be disposed on the region defined by the opening.

The organic emission layer 120 defines each pixel area by the pixel electrode 112 and the pixel define layer 113. In such an embodiment, one pixel area may be defined as an area where is formed with one organic emission unit layer which is contacted with one pixel electrode 112 divided by the pixel define layer 113.

In one embodiment of the display device 10, for example, the organic emission layer 120 may be defined as a first pixel area, a second pixel area, and a third pixel area, and each pixel area is spaced apart from each other with a predetermined interval Wd by the pixel define layer 113. According to an embodiment, unit layers pertaining to the first to the third pixel areas in the organic emission layer 120 are defined as first to third organic emission layers 120a to 120c, respectively.

In FIG. 1, widths of the first to the third pixel areas are represented by "Wpx1", "Wpx2", and "Wpx3", respectively. A width of each of the first to third pixel areas may be the same as a width of each of the first to the third organic emission layers 120a to 120c, respectively. Herein, the term "overlapping a pixel area" means being at a position overlapping an area of "Wpx1", "Wpx2", or "Wpx3" when viewed from a plan view in a thickness direction of the first substrate 111.

In an embodiment, the organic emission layer 120 may emit a third light in visible light region or an ultraviolet ("UV") region. In such an embodiment, each of the first to the third pixel areas of the organic emission layer 120 may emit the third light. In an embodiment, the third light may be a light having the highest energy in the visible light region, for example, may be a blue light.

As described above, when all pixel areas of the organic emission layer 120 are designed to emit a same light as each other, each pixel area of the organic emission layer 120 may be all formed of a same or similar material or may show same or similar properties. Thus, in such an embodiment, a process difficulty of forming the organic emission layer 120 may be lowered, such that the display device 10 may be easily applied for the large scale/large area process.

However, the organic emission layer 120 is not limited thereto, but alternatively, the organic emission layer 120 may be designed to emit at least two different lights from each other.

The organic emission layer 120 includes an organic emission unit layer in each pixel area, and the each organic emission unit layer may further include an auxiliary layer (e.g., hole injection layer ("HIL"), hole transport layer ("HTL"), electron transport layer ("ETL"), etc.) besides the emission layer.

The common electrode 114 may function as a cathode of the display device 10. The common electrode 114 may include or be formed of a transparent conductive material such as ITO or ZO. The common electrode 114 may be disposed on the organic emission layer 120 and may be integrally formed as a single unit covering all of the pixel areas.

A first planarization layer 115 is disposed on the common electrode 114. The first planarization layer 115 may include an insulating material for providing electrical insulation with the common electrode 114. The first planarization layer 115 may include a first layer disposed directly on a surface of the common electrode 114 and including an insulating material and a second layer disposed on the first layer and including an inorganic material and/or an organic material. In an embodiment, the first planarization layer 115 may have a structure of a first layer and a second layer or at least two layers of stacking an organic layer and an inorganic layer.

A light-focusing layer 150 is disposed on the upper planar surface of the first planarization layer 115. The light-focusing layer 150 may include a first light-focusing part 150a to a third light-focusing part 150c disposed to overlap the first to the third pixel areas, respectively.

In an embodiment, the light-focusing layer 150 controls a path of the third light in a way such that the third light emitted from the organic emission layer 120 is entered into a color filter layer 130 which will be described later. In such an embodiment, each of the first to the third light-focusing parts 150a to 150c may control a path of light scattering toward an adjacent pixel area among the third light emitted from a corresponding one of the first to the third organic emission layers 120a to 120c, such that the light path is in a corresponding pixel area.

Accordingly, the light-focusing layer 150 prevents the third light emitted from each pixel area of the organic emission layer 120 from being scattered to the adjacent other pixel area, such that an unintended cross talk in first to third color filters 130r, 130g, and 130b may be minimized. In such an embodiment, the display device 10 controls the light path of the third light through the light-focusing layer 150, so that the display device 10 may display an image having a high color uniformity in each pixel.

In an embodiment, a refractive index of the light-focusing layer 150 may be variously determined depending upon a material, a refractive index, a thickness or the like of the first planarization layer 115 or the sealing layer 119. In one embodiment, for example, the refractive index of the light-focusing layer 150 may be greater than or equal to about 1.5, greater than or equal to about 1.6, greater than or equal to about 1.7, greater than or equal to about 1.8, greater than or equal to about 1.9, or greater than or equal to about 2.0, and, for example, less than or equal to about 2.8, less than or equal to about 2.7, less than or equal to about 2.6, less than or equal to about 2.5, or less than or equal to about 2.4. In one embodiment, for example, the refractive index of the light-focusing layer 150 may be in a range of about 1.5 to about 2.5, or about 1.5 to about 2.0.

When the light-focusing layer 150 has the refractive index within the range described above, the light-focusing layer 150 may show a relatively high refractive index than those of other constituent elements adjacent thereto, so the light-focusing layer 150 may not spread but focus the third light emitted from the organic emission layer 120 thereto.

In an embodiment, each of the first to the third light-focusing parts 150a to 150c in the light-focusing layer 150 may have a variety of sizes and/or shapes and/or disposition relationships.

Figure 2:
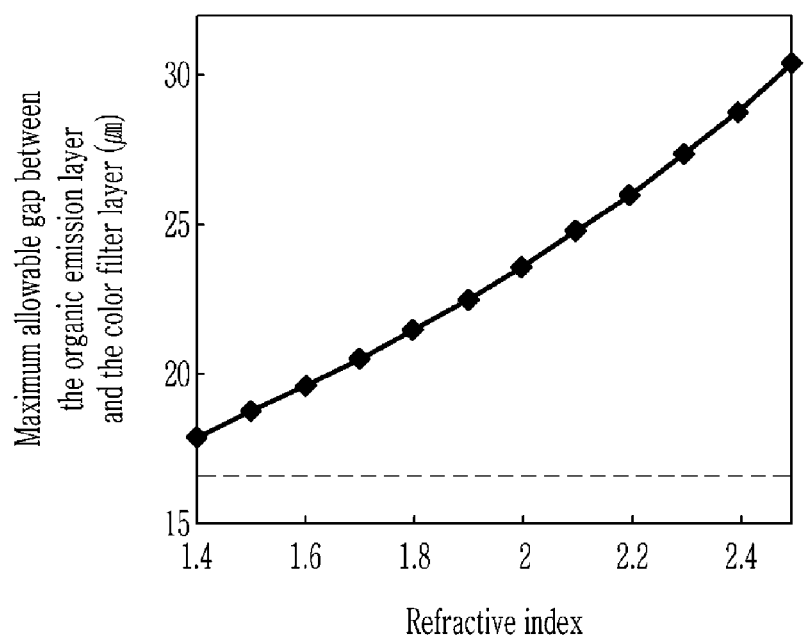
FIG. 2 shows a change of maximum allowable gap of between an organic emission layer and a color filter layer depending upon changing a refractive index of a light-focusing layer in a display device according to an embodiment.

FIG. 2 shows a change of a maximum allowable gap between the organic emission layer and the color filter layer depending upon changing a refractive index of the light-focusing layer in the display device according to an embodiment.

In FIG. 2, the changed value when applying the light-focusing layer 150 is expressed by a solid line graph, and the relationship when including no light-focusing layer is expressed by a dashed line graph (comparative). In a case of not including the light-focusing layer, as shown by the dashed line graph, the light path may be not controlled since the light-focusing layer 150 is not present, so the maximum allowable gap between the organic emission layer 120 and the color filter layer 130 is expressed by a constant value.

FIG. 2 shows graphs when the width of the pixel area is designated to be about 100 micrometers, and the interval between pixel areas (for example, shown by Wd in FIG. 1) is designated to be about 20 micrometers. In the solid line graph of FIG. 2 is obtained for a case where a convex lens having a tilting angle of about 65.4 degree is used as the light-focusing layer 150, and light having an intensity of 30% relative to straight light having an incident angle of 0 degree, with a reference of an angle of light entered to the color filter, is controlled not to interfere an adjacent pixel, the maximum allowable gap between the organic emission layer 120 and the color filter layer 130 is shown in every refractive index of the light-focusing layer 150.

Referring to FIG. 2, it is shown that the maximum allowable gap between the organic emission layer 120 and the color filter layer 130 is gradually increased as the refractive index of the light-focusing layer 150 is increased. However, considering tendencies to provide the higher integration, the ultra-thinner film, and the ultra-smaller size of the display device 10, it is undesired to increase a gap between the organic emission layer 120 and the color filter layer 130 more than required.

Accordingly, when the refractive index of the light-focusing layer 150 is adjusted within the range described above, the light-focusing layer 150 may effectively focus a third light emitted from the organic emission layer 120 while not increasing the volume of the display more than required and with a relatively high refractive index in a relationship with the adjacent other constituent elements.

Figure 3:
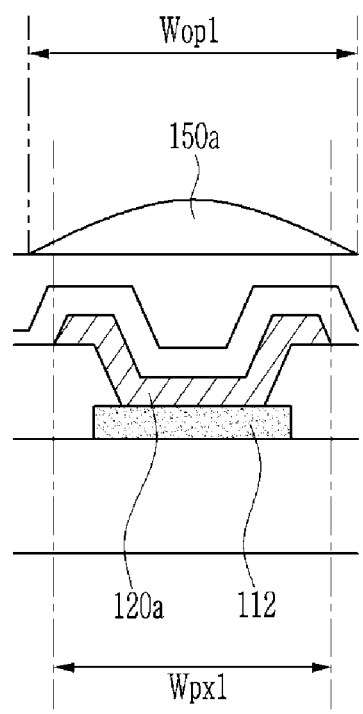
FIGS. 3 and 4 are cross-sectional views showing a width relationship between a light-focusing part and a pixel area in a display device according to an embodiment, respectively.
Figure 4:
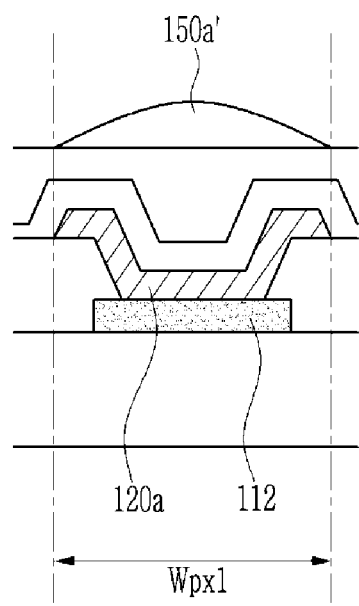

FIGS. 3 and 4 are cross-sectional views each showing a width relationship between the light-focusing part and the pixel area in the display device according to an embodiment.

In an embodiment of the display device 10, a width of each of the first to the third light-focusing parts 150a to 150c may be greater than or equal to a width of a corresponding one of the first to the third pixel areas (Wpx1 to Wpx3). For convenience of illustration and description, FIGS. 3 and 4 shows a width of the first pixel area with a width of the first light-focusing part 150a. In such an embodiment, as show in FIG. 3, a width Wop1 of the first light-focusing part 150a is wider than the width Wpx1 of the first pixel area. Alternatively, as shown in FIG. 4, a width of a first light-focusing part 150a' may be substantially the same as the width Wpx1 of the first pixel area.

Each of the first to the third light-focusing parts 150a to 150c may have a width that is greater than or equal to each width (Wpx1 to Wpx3) of the first to the third pixel areas, such that the light-focusing layer 150 may effectively focus third light which is emitted near to both lateral sides of the organic emission layer 120 or is spread to the adjacent pixel area in a light path.

FIGS. 5 to 8 are views showing a shape of the light-focusing part according to various embodiment.

In embodiments, each of the first to the third light-focusing parts 150a to 150c may include a convex lens (referring to FIG. 5), a micro-prism (referring to FIG. 6), a planar lens (referring to FIG. 7), a Fresnel lens (referring to FIG. 8), a meta-material or a combination thereof. In one embodiment, for example, all of the first to the third light-focusing parts 150a to 150c include a convex lens as shown in FIG. 1. Alternatively, the first light-focusing part 150a includes a convex lens, and the second to the third light-focusing parts 150b and 150c may each include one selected from a micro-prism, a planar lens, a Fresnel lens and a meta-material.

In an embodiment, where at least one of the first to third light-focusing parts 150a to 150c includes a convex lens, a tilting angle (φ) of the convex lens may be variously determined depending upon a material, a refractive index, a thickness, and the like of the adjacent first planarization layer 115 or the sealing layer 119. In an embodiment, the tilting angle (φ) of the convex lens may be, for example, greater than or equal to about 40 degree, greater than or equal to about 50 degree, or greater than or equal to about 60 degree, and for example, less than or equal to about 90 degree or less than or equal to about 80 degree or, for example, about 50 degree to about 90 degree, or about 60 degrees to about 80 degrees.

Figure 5:
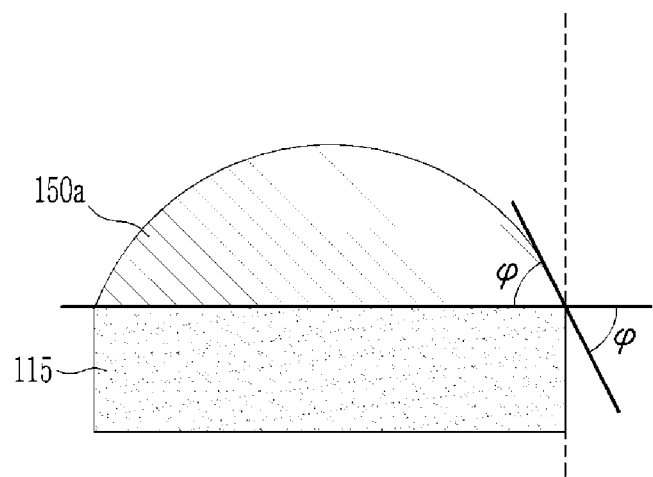
FIGS. 5 to 8 are views showing a variety of shape examples of a light-focusing part according to an embodiment, respectively.

In such an embodiment, referring to FIG. 5, for example, where the first light-focusing part 150a is formed with a convex lens, a tilting angle (φ) of the first light-focusing part 150a from the upper surface of the first planarization layer 115 is within the range described above.

In an alternative embodiment, where at least one of the first to the third light-focusing parts 150a to 150c includes a micro-prism, a tilting angle of the micro-prism may be variously determined depending upon a material, a refractive index, a thickness, or the like of the first planarization layer 115 or the sealing layer 119. In an embodiment, the tilting angle of the micro-prism may be, for example, greater than or equal to about 20 degrees, greater than or equal to about 30 degrees, greater than or equal to about 40 degrees, greater than or equal to about 50 degrees and, for example, less than about 90 degrees or less than or equal to about 80 degrees, or for example, about 20 degrees to about 80 degrees.

Figure 6:
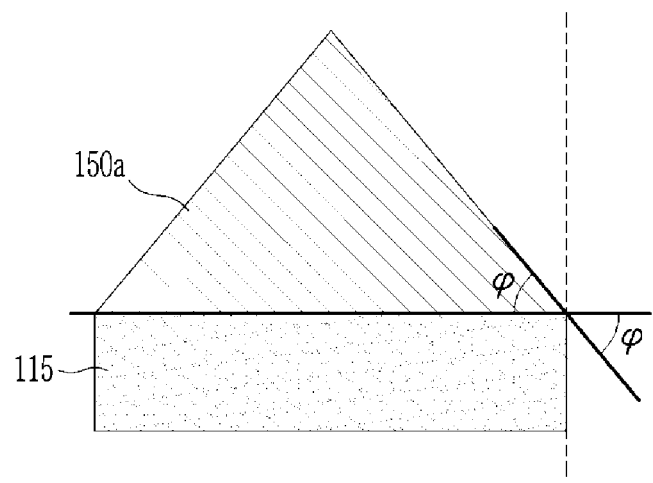
Figure 7:
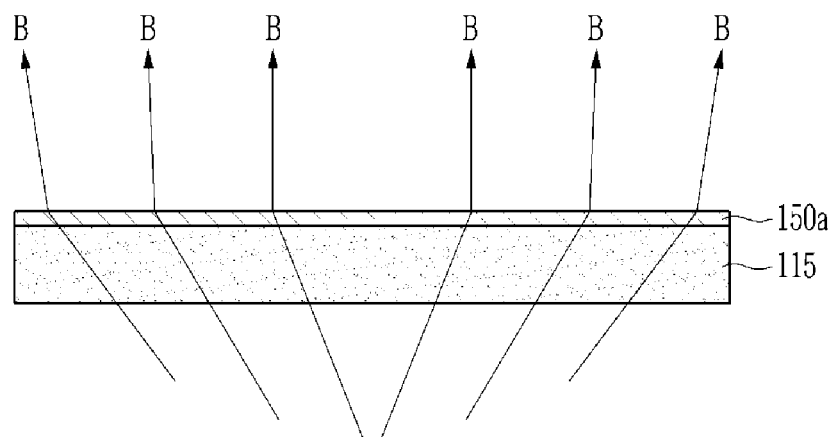
Figure 8:
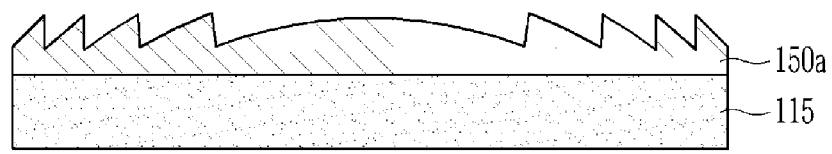

In such an embodiment, referring to FIG. 6, for example, where the first light-focusing part 150a is formed with a micro-prism, a tilting angle (φ) of the first light-focusing part 150a from the upper surface of the first planarization layer 115 may be within the range described above.

In such an embodiment, the tilting angle of the convex lens and/or the micro-prism is with the ranges described above, such that the convex lens and/or the micro-prism may effectively focus third light which is emitted near to the both lateral sides of the organic emission layer 120 and is spread to the adjacent pixel area in the light path although the gap between the organic emission layer 120 and the color filter layer 130 is somewhat increased.

Figure 9:
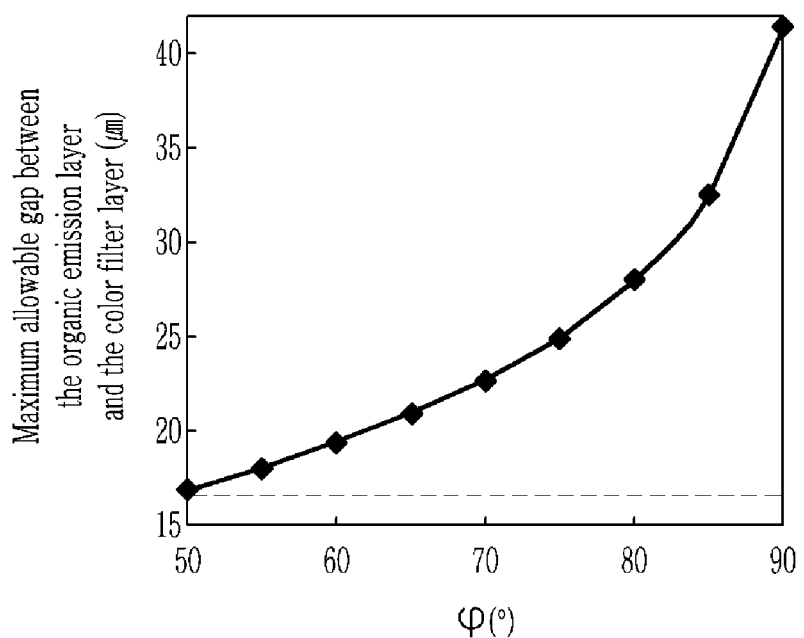
FIG. 9 shows a change of a maximum allowable gap of between an organic emission layer and a color filter layer depending upon changing a tilting angle of a light-focusing layer in a display device according to an embodiment.

FIG. 9 shows a change of a maximum allowable gap of between the organic emission layer and the color filter layer depending upon a tilting angle of the light-focusing part according to an embodiment.

In FIG. 9, similar to FIG. 2, the changing value of the case of employing the light-focusing layer 150 is represented by a solid line graph, and the relationship at a case that the light-focusing layer is not present is represented by a dashed line graph (comparative).

In addition, in FIG. 9, the graph is obtained for a case where a width of the pixel area is about 100 micrometers, and a gap between pixels is about 20 micrometers, which are the same as the conditions of FIG. 2.

Although the light-focusing layer 150 uses a convex lens having a refractive index of about 1.75 for the solid line graph of FIG. 9, a micro-lens having a refractive index of about 1.75 may obtain the same results. In addition, with reference to an angle of light entered to the color filter, the maximum allowable gap of between the organic emission layer and the color filter layer is shown in each tilting angle of the light-focusing layer when controlling the light having an intensity of 30% relative to the intensity of the straight light having an incident angle of 0 degree not to interfere the adjacent other pixel.

Referring to FIG. 9, it is shown that the maximum allowable gap between the organic emission layer 120 and the color filter layer 130 is also increased as the tilting angle of the light-focusing layer 150 is increased. However, as in FIG. 2, considering the tendency to provide a display device 10 with the higher integration, the ultra-thinner film, the down-size, it is not desired to increase a gap between the organic emission layer 120 and the color filter 130 layer more than required.

Accordingly, in an embodiment of the invention, the tilting angle of the light-focusing layer 150 is determined to be within the range described above, the light-focusing layer 150 may not spread and effectively focus third light emitted from the organic emission layer 120 while preventing undesired volume increase of the display device 10.

In an embodiment, where the light-focusing layer 150 includes a micro-prism, unlike the convex lens, the tilting angle may be at least less than about 90 degree. In such an embodiment, as the micro-prism has the higher tilting angle, the height is increased, so the tilting angle when using the micro-prism may be greater than the minimum tilting angle when using the convex lens, and, the maximum tilting angle when using the microprism may be less than or equal to the maximum tilting angle when using the convex lens.

Figure 10:
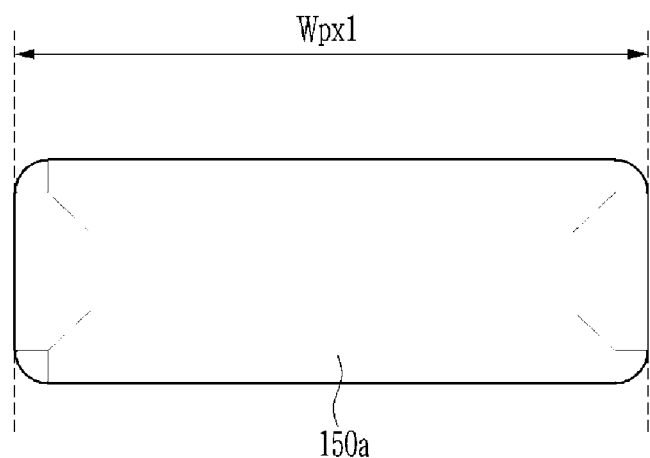
FIGS. 10 to 12 are views showing a variety of disposition relationships in a pixel area of a light-focusing part according to an embodiment, respectively.
Figure 11:
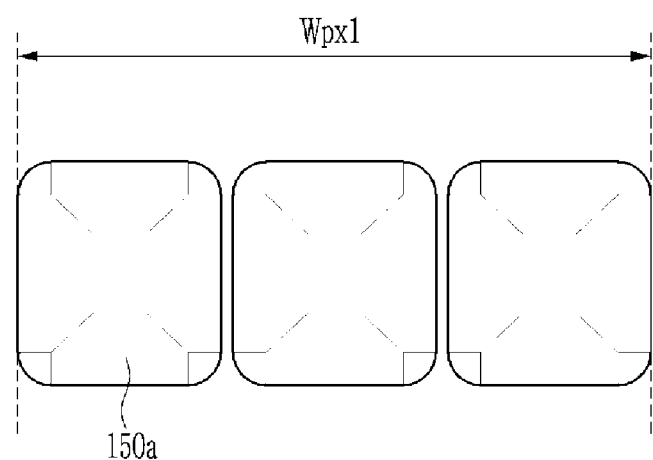
Figure 12:
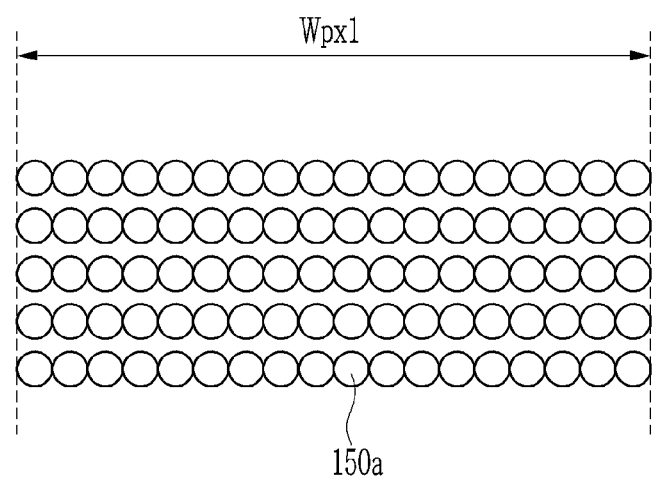

FIGS. 10 to 12 are views showing alignment relationships in the pixel area of the light-focusing part according to various embodiments.

In one embodiment, for example, the first to the third light-focusing parts 150a to 150c may be each disposed with any one selected from a planar lens, a micro-prism, a Fresnel lens, and a metamaterial, each overlapping each pixel area (referring to FIG. 10), but is not limited thereto. In on alternative embodiment, for example, at least two of the first to the third light-focusing parts 150a to 150c is disposed to overlap each pixel area (referring to FIGS. 11 and 12).

In an embodiment of the display device 10, a size and/or a shape and/or a disposition relationship of the of light-focusing layer 150 may be variously modified depending upon a material, a refractive index, a thickness or the like of the adjacent first planarization layer 115 or sealing layer 119, to allow the light-focusing layer 150 to efficiently focus the third light.

In an embodiment of the display device 10, referring back to FIG. 1, a sealing layer 119 is disposed on the light-focusing layer 150 to seal a first panel. The sealing layer 119 protects the organic emission layer 120 from extraneous moisture, oxygen and the like. The sealing layer 119 may include a getter absorbing moisture. Alternatively, the sealing layer 119 may include a getter layer including at least one getter.

In an embodiment, the sealing layer 119 may have a lower refractive index than the light-focusing layer 150, such that the light-focusing layer 150 may control a light path of the third light emitted from the organic emission layer 120 in a direction of focusing light.

The sealing layer 119 also functions as adhesive layer that attaches the first panel to a second panel, such that the first panel may be effectively attached to the second panel to function as a display device 10.

In an embodiment, the second panel of the display device 10 includes the second substrate 116, the adhesion layer 2 and the cover layer 1 disposed on the upper surface of the second substrate 116, the first optical filter layer 160 disposed under the second substrate 116, at least two light blocking members 117 directly under the first optical filter layer 160, the color filter layer 130 covering neighboring light blocking members 117, the second planarization layer 118 under the color filter layer 130, and the second optical filter layer 140 under the second planarization layer 118.

The second substrate 116 may include an insulating material and may have flexibility. In one embodiment, for example, the second substrate 116 may include or be formed of glass, quartz, and ceramic or may be a flexible substrate made of a plastic. The second substrate 116 may include or be made of a polymer material such as PI, PC, PES, PET, PEN, PAR, an FRP, and the like. In an embodiment, the second substrate 116 may be an optically transparent substrate since the second substrate 116 is disposed in a direction that light is emitted through the color filter layer 130.

A light blocking member 117 may be disposed in a position overlapping the pixel define layer 113 of the first panel. At least two light blocking members 117 are disposed with a predetermined interval, such that the first to the third color filters 130r, 130g, and 130b of the color filter layer 130 overlap the first to the third pixel areas, respectively. According to an embodiment, the light blocking member 117 is disposed directly under a first optical filter layer 160, but is not limited thereto. In one alternative embodiment, for example, the light blocking member 117 may be disposed directly under the second substrate 116 according to the disposition relationship of the first optical filter layer 160.

The light blocking member 117 may include or be made of a light-blocking material, for example, a material including a metal particle such as chromium (Cr), silver (Ag), molybdenum (Mo), nickel (Ni), titanium (Ti), tantalum (Ta), and the like, an oxide of the metal particle, or a combination thereof. The light blocking member 117 effectively prevents a light leakage phenomenon of the display device 10 and improves a contrast.

The color filter layer 130 is disposed between and to cover the adjacent light blocking members 117. The color filter layer 130 includes first to third color filters 130r, 130g, and 130b disposed in positions overlapping the first to the third pixel areas, respectively.

According to an embodiment, the first color filter 130r may emit a first light different from the third light, the second color filter 130g may emit a second light different from the third light, and the third color filter 130b may emit the third light. According to an embodiment, the first light may be a red light, the second light may be a green light, and the third light may be a blue light or a UV light.

However, an embodiment is not limited thereto, but a kind of the first light to the third light may be variously modified according to a kind of quantum dots 3, the used material of the organic emission layer 120, and the like.

In an embodiment, the color filter layer 130 may include quantum dots 3 for converting the third light supplied from the organic emission layer 120 to the first light and/or the second light and emitting the converted light. According to an embodiment, quantum dots 3 may include first quantum dots 3r included in the first color filter 130r and second quantum dots 3g included in the second color filter 130g.

According to an embodiment, the first and the second color filters 130r and 130g include the first and the second quantum dots 3r and 3g, respectively, and the first and the second quantum dots 3r and 3g may be obtained by coating first and second photosensitive compositions including a binder, a photopolymerizable monomer, a photoinitiator and a solvent on the first and the second pixel areas, respectively, as shown in FIG. 1, and curing the coated first and second photosensitive compositions.

In an embodiment, the first quantum dots 3r and the second quantum dots 3g may be formed of a same material as each other but may have different sizes from each other, so that the entered third light may be differently emitted as a first light and a second light which are different from each other.

In one embodiment, for example, the second quantum dots 3g may have a smaller size than the first quantum dots 3r, s to emit a green light having a center wavelength of about 530±5 nm, an FWHM from about 40 nm to about 60 nm, and a relatively high energy. In such an embodiment, the second quantum dots 3g has a larger size than the first quantum dots 3r to emit a red light having a center wavelength of about 625±5 nm, an FWHM from about 40 nm to about 60 nm, and a relatively low energy.

However, an embodiment is not limited thereto, but the first and the second quantum dots 3r and 3g may be formed of different materials from each other.

The quantum dots 3 may have at least one of shapes of quantum dots known in the art, and may not be particularly limited. The quantum dots 3 may have a spherical shape as shown in FIG. 1, or may be, for example, a pyramidal, multi-armed, or a cube nanoparticle, a nanotube, a nanowire, a nanofiber or a nanosheet.

In an embodiment, a material of the quantum dots 3 is not particularly limited and the quantum dots 3 may be known or commercially available. In one embodiment, for example, the quantum dots may include a Group II-VI compound, a Group III-V compound, a Group IV-VI compound, a Group IV compound, or a combination thereof.

The Group II-VI compound may be at least one selected from: a binary element compound selected from CdSe, CdTe, ZnS, ZnSe, ZnTe, ZnO, HgS, HgSe, HgTe, MgSe and MgS; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe and MgZnS; a quaternary element compound selected from HgZnTeS, CdZnSeS, CdZnSeTe, CdZnSTe, CdHgSeS, CdHgSeTe, CdHgSTe, HgZnSeS, HgZnSeTe and HgZnSTe, and a mixture thereof.

The Group III-V compound may be at least one selected from: a binary element compound selected from GaN, GaP, GaAs, GaSb, AlN, AlP, AlAs, AlSb, InN, InP, InAs and InSb, a ternary element compound selected from GaNP, GaNAs, GaNSb, GaPAs, GaPSb, AlNP, AlNAs, AlNSb, AlPAs, AlPSb, InNP, InNAs, InNSb, InPAs and InPSb, a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs and InAlPSb, and a mixture thereof. The Group IV-VI compound may be at least one selected from: a binary element compound selected from SnS, SnSe, SnTe, PbS, PbSe and PbTe; a ternary element compound selected from SnSeS, SnSeTe, SnSTe, PbSeS, PbSeTe, PbSTe, SnPbS, SnPbSe and SnPbTe; a quaternary element compound selected from SnPbSSe, SnPbSeTe and SnPbSTe; and a mixture thereof.

The Group IV compound may be a single substance selected from Si and Ge, a binary element compound selected from SiC and SiGe, or a mixture thereof.

The binary element compound, the ternary element compound or the quaternary element compound of a particle respectively exist in a uniform concentration in a particle or in partially different concentrations in the same particle. The quantum dots 3 may have a core/shell structure where one quantum dot surrounds another quantum dot. The core and the shell may have a concentration gradient where the concentration of the element(s) of the shell decreases toward the core. In addition, the quantum dots 3 may have a single semiconductor nanocrystal core and multi-shells surrounding the core. Herein, the multi-layered shell structure has a structure of two or more shells and each shell may have a single composition or an alloy or may have a concentration gradient.

In addition, the quantum dots 3 have a material composition of the shell having a larger energy bandgap than that of the core, which may exhibit an effective quantum confinement effect. In such a multi-layered shell, an outer shell may have a higher energy bandgap than an inner shell that is near to the core and the light converted by the quantum dots may be in an UV to infrared wavelength range.

The quantum dots 3 may have quantum efficiency of greater than or equal to about 10%, for example, greater than or equal to about 30%, greater than or equal to about 50%, greater than or equal to about 60%, greater than or equal to about 70%, or greater than or equal to about 90%.

According to an embodiment, the third color filter layer 130b may be defined by a transparent body, so that the third light supplied from the organic emission layer 120 may be emitted as it is without being converted. In such an embodiment, the third color filter layer 130b may not include quantum dots 3 unlike the first and the second color filters 130r and 130g. In such an embodiment, the transparent body may include a scattering inducer (not shown) which does not change a wavelength of the third light but only change a propagation direction thereof.

According to an embodiment, the first to the third color filters 130r, 130g and 130b may have widths the same as the widths Wpx1, Wpx2 and Wpx3 of the first to the third pixel areas, respectively, such that an unintended cross talk in the first to the third color filters 130r, 130g, and 130b is substantially minimized.

The second planarization layer 118 is disposed directly under the color filter layer 130. The second planarization layer 118 may include a same material and/or have a same disposition structure as the first planarization layer 115, or may include a different material from the first planarization layer 115.

The second planarization layer 118 functions to planarize the lower surface of the color filter layer 130 to allow a second optical filter layer 140, which will be described later, to be disposed or formed on a planar or flat surface. The second planarization layer 118 may include or be formed of an optically transparent material. According to an embodiment, the second planarization layer 118 may have an absorption rate, for light within a visible light region, of less than or equal to about 10%, for example, less than or equal to about 9%, less than or equal to about 8%, less than or equal to about 7%, less than or equal to about 6%, less than or equal to about 5%, less than or equal to about 4%, less than or equal to about 3%, less than or equal to about 2%, less than or equal to about 1%, or even about 0%.

However, the functions of the second planarization layer 118 are not limited thereto. In one alternative embodiment, for example, the second optical filter layer 140 is omitted from the display device 10, and the second planarization layer 118 may be disposed to directly contact the sealing layer 119. In such an embodiment, the second planarization layer 118 functions to sufficiently contact the second panel to the first panel without spacing from the upper surface and bubbles thereon.

Hereinafter, the first optical filter layer and the second optical filter layer according to an embodiment will be described in detail with references to FIGS. 13 and 14 in addition to FIG. 1.

Figure 13:
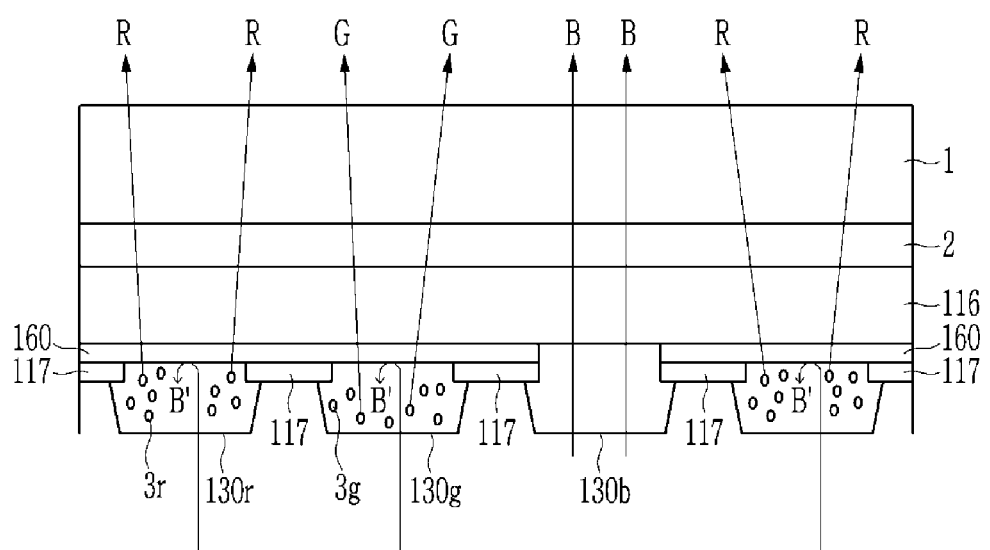
FIG. 13 is a cross-sectional view showing a function of a first optical filter layer in a display device according to an embodiment.

FIG. 13 is a cross-sectional view showing a function of the first optical filter layer in the display device according to an embodiment.

Referring to FIGS. 1 and 13, an embodiment of the display device 10 may include a first optical filter layer 160 disposed between the second substrate 116 and the color filter layer 130. In such an embodiment, the first optical filter layer 160 blocks at least a part of the third light.

The first optical filter layer 160 may be disposed directly under the second substrate 116. The first optical filter layer 160 may be disposed to overlap the first pixel area and the second pixel area.

According to an embodiment, the first optical filter layer 160 may be disposed on all positions overlapping each of the first and the second pixel areas.

In an embodiment, the first optical filter layer 160 may be integrally formed in a single unitary unit and disposed to overlap an entire bottom surface of the second substrate 116 except with a portion overlapping the third pixel area, as shown in FIG. 13. In such an embodiment, an opening is defined in the first optical filter layer 160 at a position overlapping the third pixel area. However, an embodiment is not limited to the disposition relationship.

In an embodiment, the color filter layer 130 is disposed on the first optical filter layer 160 to be positioned between the first optical filter layer 160 and the second optical filter layer 140, and a specific disposition relationship between the first optical filter layer 160 and the color filter layer 130, the light blocking member 117, and the second substrate 116 may be variously modified. In one embodiment, for example, the first optical filter layer 160 may be disposed between the second substrate 116 and the adhesion layer 2, or the first optical filter layer 160 may be disposed between the light blocking member 117 and the color filter layer 130.

In an embodiment, the first optical filter layer 160 may be divided into portions not integrally formed with each other. In one embodiment, for example, the first optical filter layer 160 may include at least two portions spaced apart from each other and disposed to overlap the first and the second pixel areas, respectively.

The first optical filter layer 160 may block light in, for example, a predetermined wavelength region in the visible light region and may transmit light in the other wavelength regions. In one embodiment, for example, the first optical filter layer 160 may block blue light and may transmit light except the blue light. In one alternative embodiment, for example, the first optical filter layer 160 may transmit green light, red light, and/or yellow light which is a mixed light thereof.

The first optical filter layer 160 may substantially block (i.e. reflect or absorb), for example, a blue light having a wavelength less than or equal to about 500 nm, and may have a property to transmit a wavelength region between the remaining visible light wavelength region of greater than about 500 nm and less than or equal to about 700 nm. In one embodiment, for example, the first optical filter layer 160 may have a light transmittance of greater than or equal to about 70%, greater than or equal to about 80%, greater than or equal to about 90%, or even about 100% for the other visible light having a wavelength greater than or equal to 500 nm and less than or equal to about 700 nm.

The first optical filter layer 160 may be a polymer thin film including a dye and/or a pigment for absorbing a wavelength to be blocked, and may absorb a blue light at greater than or equal to about 80%, greater than or equal to about 90%, greater than or equal to about 95%, but may have a light transmittance of greater than or equal to about 70%, greater than or equal to about 80%, greater than or equal to about 90%, and even about 100% to the other visible light having a wavelength greater than about 500 nm and less than or equal to about 700 nm.

In an embodiment, the first optical filter layer 160 may substantially block a blue light having a wavelength less than or equal to about 500 nm by absorbing the same, and the first optical filter layer 160 may selectively transmit, for example, a green light or a red light. In such an embodiment, the first optical filter layer may include at least two portions disposed spaced apart from each other and disposed to overlap the first to the second pixel areas, respectively. In one embodiment, for example, a portion of the first optical filter layer that selectively transmits a red light may be disposed in a region overlapping the first pixel area, and another portion of the first optical filter layer that selectively transmits a green light may be disposed on a region overlapping the second pixel area.

The first optical filter layer 160 may include a reflective filter including a plurality of layers having different refractive indexes from each other as in the second optical filter layer 140. In one embodiment, for example, the first optical filter layer 160 may be formed by alternatively stacking two layers having different refractive indexes from each other, for example, by alternatively (and/or repeatedly) stacking a layer having a high refractive index and a layer having a low refractive index one on another.

As refractive index difference between the layer having a high refractive index and the layer having a low refractive index is higher, the first optical filter layer 160 has the higher selectivity to a wavelength.

A thickness and the stacked number of the layer having a high refractive index and the layer having a low refractive index may be determined according to a refractive index of each layer and a wavelength to be reflected. In one embodiment, for example, each layer having a high refractive index may have a thickness in a range of about 3 nm to about 300 nm, and each layer having a low refractive index may have a thickness in a range of about 3 nm to about 300 nm.

The total thickness of the first optical filter layer 160 may be, for example, in a range of about 3 nm to about 10000 nm, about 300 nm to about 10000 nm, or about 1000 nm to about 10000 nm. All layers having a high refractive index may have a same thickness as each other and may include a same material as each other or different materials from each other, and all layers having a low refractive index may have a same thickness as each other and may include a same material as each other or different materials from each other.

In an embodiment, the first optical filter layer 160 may be formed by binding a reflective filter, in which materials having different refractive indexes from each other are stacked, under an absorptive optical filter, which includes at least two layers alternatively stacked.

In an embodiment, as described above, the first optical filter layer 160 blocks a blue light among the visible light and transmits other lights except the blue light, for example, a green light, a red light, and/or a yellow light which is a mixed light thereof, so that the display device 10 may express an image having improved color purity and color reproducibility.

In an embodiment, as shown in FIG. 13, an adhesion layer 2 and a cover layer 1 may be substantially stacked on the second substrate 116.

The adhesion layer 2 may attach and fix the cover layer 1 and the first optical filter layer 160, and may include the various disclosed materials.

The cover layer 1 may function to protect inside constituent elements from the outside of the display device 10. The cover layer 1 may include, for example, an overcoat layer, a window layer or the like. But, an embodiment is not limited thereto, but the cover layer 1 and the adhesion layer 2 may be modified or omitted.

In an embodiment the display device 10, the second optical filter layer 140 may be formed directly under the second planarization layer 118 to provide a relatively planar surface, as shown in FIG. 1.

In an embodiment, the second optical filter layer 140 may include a monolayer having a low refractive index. In one embodiment, for example, the second optical filter layer 140 may be a transparent thin film having a refractive index of less than or equal to about 1.4, less than or equal to about 1.3, or less than or equal to about 1.2.

The second optical filter layer 140 having a low refractive index may include, for example, a porous silicon oxide, a porous organic material, a porous organic/inorganic composite, or a combination thereof.

In an embodiment, the second optical filter layer 140 may include a plurality of layers having different refractive indexes from each other. In one embodiment, for example, the second optical filter layer 140 may be formed by alternatively stacking two layers having different refractive indexes from each other, or may be formed by alternatively stacking a material having a high refractive index and a material having a low refractive index.

The layer having a high refractive index in the second optical filter layer 140 may include, for example, at least one selected from hafnium oxide, tantalum oxide, titanium oxide, zirconium oxide, magnesium oxide, cesium oxide, lanthanum oxide, indium oxide, niobium oxide, aluminum oxide, and silicon nitride, but not being limited thereto. In such an embodiment, the layer having a high refractive index in the second optical filter layer 140 may include another material having a higher refractive index than the layer having a low refractive index in the second optical filter layer 140.

The layer having a low refractive index in the second optical filter layer 140 may include, for example, a silicon oxide, but not being limited thereto. In such an embodiment, the layer having a low refractive index in the second optical filter layer 140 may include another material having a lower refractive index than the layer having a high refractive index in the second optical filter layer 140.

As the refractive index difference between the layer having a high refractive index and the layer having a low refractive index is the higher, the second optical filter layer 140 may have the higher selectivity to a wavelength.

In the second optical filter layer 140, each thickness of the layer having a high refractive index and the layer having a low refractive index and the stacked number thereof may be determined depending upon a refractive index of each layer and the wavelength to be reflected. In one embodiment, for example, each layer having a high refractive index in the second optical filter layer 140 may have a thickness in a range of about 3 nm to about 300 nm, and each layer having a low refractive index in the second optical filter layer 140 may have a thickness in a range of about 3 nm to about 300 nm. The total thickness of the second optical filter layer 140 may be in a range of, for example, about 3 nm to about 10000 nm, about 300 nm to about 10000 nm, or about 1000 nm to about 10000 nm. Each of the layer having a high refractive index and the layer having a low refractive index in the second optical filter layer 140 may have a same thickness and material as each other or different thicknesses and materials from each other.

Figure 14:
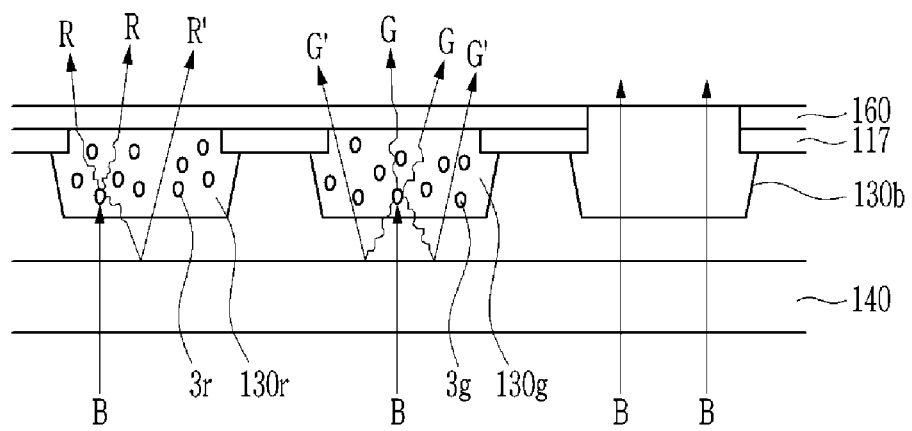
FIG. 14 is a cross-sectional view showing a function of a second optical filter layer in a display device according to an embodiment.

FIG. 14 is a cross-sectional view showing a function of the second optical filter layer in the display device according to an embodiment.

In an embodiment, the second optical filter layer 140 reflects at least a part R', G' of the first light R and the second light G and transmits at least a part of the third light B.

In such an embodiment, the second optical filter layer 140 may transmit only the third light B in a blue light wavelength region or a wavelength region of less than or equal to about 500 nm, as shown in FIG. 14, and light in a wavelength region of greater than about 500 nm, which is a green light G, a yellow light, a red light R or the like, may not be passed through the second optical filter layer 140 but be reflected G', R'. Thus, the reflected green and red lights G', R' may pass through the first and the second color filters 130r and 130g to be emitted to the outside of the display device 10.

The second optical filter layer 140 may reflect the light in a wavelength region of greater than about 500 nm with a reflectance of greater than or equal to about 70%, greater than or equal to about 80%, or greater than or equal to about 90%, or even about 100%.

In an embodiment, the second optical filter layer 140 may transmit the light in a wavelength region of less than or equal to about 500 nm with a transmittance of, for example, greater than or equal to about 90%, greater than or equal to about 92%, greater than or equal to about 94%, greater than or equal to about 96%, greater than or equal to about 98%, greater than or equal to about 99%, or even about 100%.

As quantum dots 3 isotropically radiate light, a part of the red light R and green light G emitted by the first and the second quantum dots 3r, 3g may be radiated toward a supplying direction of the third light when the third light is supplied to the first and the second quantum dots 3r, 3g. Accordingly, if an emitting direction of the red light R and the green light G converted by quantum dots 3 is not controlled, the light efficiency of the emitted light is unavoidably deteriorated.

However, an embodiment of the display device 10 transmits a blue light using the second optical filter layer 140 and reflects a red light and green light and emits the reflected red and green lights, such that light efficiency and luminance of the display device 10 may be improved.

In an embodiment of the display device 10, a gap between the organic emission layer 120 and the color filter layer 130 may be greater than or equal to about 5 micrometers, for example, greater than or equal to about 10 micrometers, greater than or equal to about 20 micrometers, greater than or equal to about 30 micrometers, and for example, less than or equal to about 100 micrometers, less than or equal to about 50 micrometers, less than or equal to about 30 micrometers, or less than or equal to about 10 micrometers, or for example, about 5 micrometers to about 100 micrometers, or about 10 micrometers to about 100 micrometers.

In such an embodiment, the display device 10 may display an image having a higher luminance, color purity, and color reproducibility than a conventional display device in which an absorptive color filter layer is disposed on the organic emission layer. In such an embodiment, a second optical filter layer 140 having a thickness of several to several tens micrometers is used due to inherent characteristics of the quantum dots 3. Accordingly, in an embodiment, where the display device 10 is a top emission type, the gap between the organic emission layer 120 and the color filter layer 130 in the display device 10 may be slightly increased or relatively larger when compared to the conventional display device.

In such an embodiment, the third light emitted from the pixel area may be further widely spread to be entered into the color filter layer 130 due to the increased gap between the organic emission layer 120, such that the possibilities of a crosstalk occurrence between the adjacent color filters are increased.

Accordingly, in an embodiment of the display device 10, a light path of the third light through the light-focusing layer 150 is controlled as described above, such that the crosstalk between the adjacent color filters may be minimized even when the gap between the organic emission layer 120 and the color filter layer 130 is increased.

Embodiments of the display device 10 are not limited thereto, but the light-focusing layer 150 may be omitted considering the refractive index relationship between the second optical filter layer 140 and the adjacent constituent elements or in a case of employing other optical constituent elements reflecting third light under the organic emission layer 120 to control the light path to the color filter layer 130.

In an embodiment, as described above, the display device 10 converts the third light emitted from the organic emission layer 120 into first light and/or second light by quantum dots 3 included in the color filter layer 130, so the display device 10 may display an image with improved color purity and color reproducibility.

In an embodiment, where the display device 10 is a top emission type, the display device 10 may further include a second optical filter layer 140 and/or a first optical filter layer 160 considering the inherent characteristics of quantum dots 3, and may display an image with a high luminance.

In an embodiment of the display device 10, all pixel regions of the organic emission layer 120 emit a same light, such that the process difficulty of forming the organic emission layer 120 may become substantially less. As the results, such an embodiment of the display device 10 may be effectively applied for the large scale/large area process.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device, comprising:
   an organic emission layer in which a first pixel area, a second pixel area and a third pixel area are defined;
   a color filter layer disposed on the organic emission layer, wherein the color filter layer comprises first to third color filters overlapping the first to third pixel areas, respectively, wherein the first to third color filters emit first light to third light, respectively, which are different from one another;

a first optical filter layer disposed on the color filter layer, wherein the first optical filter transmits at least one of the first light and the second light, and reflects or absorbs the third light; and a light-focusing layer disposed between the color filter layer and the organic emission layer, wherein the light-focusing layer comprises first to third light-focusing parts overlapping the first to third pixel areas, respectively, wherein at least one of the first to third color filters comprises quantum dots, wherein each of the first to third pixel areas of the organic emission layer emits the third light, and wherein a gap between the organic emission layer and the color filter layer is greater than or equal to about 30 μm.

2. The display device of claim 1, wherein the first optical filter layer blocks light having a wavelength less than or equal to about 500 nm.

3. The display device of claim 1, wherein the first optical filter layer overlaps at least one of the first pixel area and the second pixel area.

4. The display device of claim 1, wherein
the first optical filter layer is integrally formed as a single unitary unit, and
an opening is defined in the first optical filter at a position overlapping the third pixel area.

5. The display device of claim 1, wherein a refractive index of the light-focusing layer is in a range from about 1.4 to about 2.5.

6. The display device of claim 1, wherein the gap between the organic emission layer and the color filter layer is less than or equal to about 100 μm.

7. The display device of claim 1, wherein each of the first to third light-focusing parts comprises a convex lens, a micro-prism, a planar lens, a Fresnel lens, a metamaterial, or a combination thereof.

8. The display device of claim 1, wherein
at least one of the first to third light-focusing parts comprises a convex lens, and
a tilting angle of the convex lens is in a range from about 30 degrees to about 90 degrees.

9. The display device of claim 1, wherein a width of each of the first to third light-focusing parts is larger than a width of a corresponding one of the first to third pixel areas.

10. The display device of claim 1, wherein at least two of each of the first to third light-focusing parts are disposed to overlap a corresponding pixel area.

11. The display device of claim 1, further comprising:
a second optical filter layer disposed between the color filter layer and the organic emission layer, wherein the second optical filter layer transmits the third light and reflects at least one of the first light and the second light.

12. The display device of claim 11, wherein the second optical filter layer reflects light having a wavelength greater than about 500 nm.

13. The display device of claim 11, further comprising:
a sealing layer disposed between the second optical filter layer and the light-focusing layer and having a refractive index lower than a refractive index of the light-focusing layer.

14. The display device of claim 1, wherein
the first light is a red light,
the second light is a green light, and
the third light is a blue light.

15. The display device of claim 1, wherein the first light has a center wavelength from 620 nm to 630 nm.

16. The display device of claim 1, wherein the second light has a center wavelength from 525 nm to 535 nm.

17. A display device, comprising:
an organic emission layer in which a first pixel area, a second pixel area and a third pixel area are defined;
a color filter layer disposed on the organic emission layer, wherein the color filter layer comprises first to third color filters overlapping the first to third pixel areas, respectively, wherein the first to third color filters emit first light to third light, respectively, which are different from one another;
a first optical filter layer disposed on the color filter layer, wherein the first optical filter transmits at least one of the first light and the second light, and reflects or absorbs the third light; and
a light-focusing layer disposed between the color filter layer and the organic emission layer, wherein the light-focusing layer comprises first to third light-focusing parts overlapping the first to third pixel areas, respectively,
wherein at least one of the first to third color filters comprises quantum dots,
wherein a gap between the organic emission layer and the color filter layer is greater than or equal to about 30 μm, wherein
at least one of the first to third light-focusing parts comprises a micro-prism, and
a tilting angle of the micro-prism is in a range from about 20 degrees to about 80 degrees.

18. A display device, comprising:
an organic emission layer in which a first pixel area, a second pixel area and a third pixel area are defined;
a color filter layer disposed on the organic emission layer, wherein the color filter layer comprises first to third color filters overlapping the first to third pixel areas, respectively, wherein the first to third color filters emit first light to third light, respectively, which are different from one another;
a first optical filter layer disposed on the color filter layer, wherein the first optical filter transmits at least one of the first light and the second light, and reflects or absorbs the third light; and
a light-focusing layer disposed between the color filter layer and the organic emission layer, wherein the light-focusing layer comprises first to third light-focusing parts overlapping the first to third pixel areas, respectively,
wherein at least one of the first to third color filters comprises quantum dots,
wherein a width of each of the first to third color filters is the same as a width of a corresponding one of the first to third pixel areas, and
wherein a gap between the organic emission layer and the color filter layer is greater than or equal tp about 30 μm.

* * * * *